US011822425B2

(12) United States Patent
Uezono et al.

(10) Patent No.: US 11,822,425 B2
(45) Date of Patent: Nov. 21, 2023

(54) PROGRAMMABLE DEVICE, AND CONTROLLER USING THE SAME

(71) Applicant: Hitachi, Ltd., Tokyo (JP)

(72) Inventors: Takumi Uezono, Tokyo (JP); Masahiro Shiraishi, Tokyo (JP); Tadanobu Toba, Tokyo (JP); Satoshi Nishikawa, Tokyo (JP); Keisuke Yamamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 17/795,025

(22) PCT Filed: Aug. 18, 2020

(86) PCT No.: PCT/JP2020/031159
§ 371 (c)(1),
(2) Date: Jul. 25, 2022

(87) PCT Pub. No.: WO2021/152887
PCT Pub. Date: Aug. 5, 2021

(65) Prior Publication Data
US 2023/0082529 A1 Mar. 16, 2023

(30) Foreign Application Priority Data
Jan. 27, 2020 (JP) .................... 2020-010493

(51) Int. Cl.
*G06F 11/10* (2006.01)
*G06F 11/07* (2006.01)

(52) U.S. Cl.
CPC ...... *G06F 11/1064* (2013.01); *G06F 11/0772* (2013.01); *G06F 11/1004* (2013.01)

(58) Field of Classification Search
CPC ............. G06F 11/1064; G06F 11/0772; G06F 11/1004; G06F 11/0793; G06F 11/10
See application file for complete search history.

(56) References Cited

U.S. PATENT DOCUMENTS

| 7,143,329 B1* | 11/2006 | Trimberger ...... H03K 19/17764 714/766 |
| 8,436,646 B1* | 5/2013 | Mendel ............ H03K 19/17724 326/38 |

(Continued)

FOREIGN PATENT DOCUMENTS

| JP | 2015-115727 A | 6/2015 |
| JP | 6263649 B2 | 1/2018 |

(Continued)

OTHER PUBLICATIONS

International Search Report (PCT/ISA/210) issued in PCT Application No. PCT/JP2020/031159 dated Nov. 2, 2020 with English translation (four (4) pages).

(Continued)

*Primary Examiner* — Daniel F. McMahon
(74) *Attorney, Agent, or Firm* — Crowell & Moring LLP

(57) ABSTRACT

The operational continuity of a programmable device, and a controller using the same is enhanced. A programmable device is configured with: an error check mechanism that detects, and notifies an error from redundantized user logic blocks; a previous value retaining section that is connected to an output terminal of a last user logic block, and takes in, and outputs an output value of the user logic blocks in each control period; a CRAM check section that receives a scan interrupt due to an error occurrence notification received from the error check mechanism, reads a scan region on the CRAM, implements error detection, and error correction, and notifies a success or failure of the error correction; and an error handling section that transmits an instruction for retaining a previous output of the user logic blocks to the previous value retaining section when the error occurrence notification is received, transmits an instruction for cancelling previous-value retention to the previous value retaining section, and also transmits a logical reset instruction to a (Continued)

user logic block relevant to an error when a notification of a success of the error correction is received from the CRAM check section.

9 Claims, 7 Drawing Sheets

(56) References Cited

U.S. PATENT DOCUMENTS

| | | | | |
|---|---|---|---|---|
| 9,934,841 B1* | 4/2018 | Langhammer | ...... | G06F 11/1048 |
| 2012/0011423 A1* | 1/2012 | Entezari | ............ | G06F 11/1004 |
| | | | | 714/E11.032 |
| 2013/0305199 A1* | 11/2013 | He | ................ | G06F 30/327 |
| | | | | 716/104 |
| 2015/0171869 A1 | 6/2015 | Takehara | | |
| 2016/0241247 A1* | 8/2016 | Kanno | ............... | H03K 19/21 |
| 2016/0266964 A1* | 9/2016 | Uekusa | ................ | G11C 29/70 |
| 2018/0113757 A1* | 4/2018 | Sakata | ................ | H03K 19/173 |
| 2018/0239665 A1* | 8/2018 | Hutton | ................ | G06F 11/106 |

FOREIGN PATENT DOCUMENTS

| | | |
|---|---|---|
| JP | 6408482 B2 | 10/2018 |
| JP | 2018-181206 A | 11/2018 |
| JP | 6488541 B2 | 3/2019 |
| WO | WO 2015/068285 A1 | 5/2015 |
| WO | WO 2016/110968 A1 | 7/2016 |
| WO | WO 2016/207933 A1 | 12/2016 |

OTHER PUBLICATIONS

Japanese-language Written Opinion (PCT/ISA/237) issued in PCT Application No. PCT/JP2020/031159 dated Nov. 2, 2020 (three (3) pages).

* cited by examiner

PROGRAMMABLE DEVICE, AND CONTROLLER USING THE SAME

TECHNICAL FIELD

The present invention relates to a technology of enhancing the operational continuity of a programmable device, and a controller using the same.

BACKGROUND ART

Controllers aimed for mission-critical applications such as plant control are required to comply with safety standards. In addition, in terms of costs, security, EOL (End of Life) measures, and the like, FPGAs (Field Programmable Gate Arrays) are used in controllers.

FPGAs, which are programmable devices that allow a user to define, and change internal logical circuits, include SRAM (Static Random Access Memory)-type FPGAs, and Flash memory-type FPGAs depending on devices to be included in configuration memories (hereinafter, denoted as CRAMs). They have a trade-off relationship in terms of performance, and noise tolerance, and are used on a case-by-case basis depending on required performance. In a case that a SRAM-type FPGA, which is relatively less noise-tolerant, is used, a CRAM cyclic check in which data in a CRAM is read out sequentially, and error detection correction is performed by using a read redundant code is performed conventionally.

As a background art, there is WO2015/068285 (Patent Literature 1). Patent Literature 1 describes that "a programmable device 100 having a configuration memory 9 includes, as means for diagnosing a configuration memory: a read/write section 2 that reads, and writes data in the configuration memory; a functional block section 7 that performs an error check on the data in the configuration memory and; a sequencer section 5 that performs control of the read/write section, and the functional block section such that error checks are performed on data in predetermined regions in the configuration memory in a predetermined order. Thereby, detection time, and correction time at a time of occurrence of a soft error in the configuration memory 9 are reduced."

CITATION LIST

Patent Literature

Patent Literature 1: WO2015/068285

SUMMARY OF INVENTION

Technical Problem

It has been known that SRAM-type FPGAs provide high performance, and additionally have high functionalities, but are less tolerant against noise from the outside such as cosmic rays, and a temporary inversion (soft error) of CRAM-stored data occurs. Accordingly, in a case that a SRAM-type FPGA is applied to a controlling apparatus or the like, it is necessary to mount a constant check mechanism for a CRAM in addition to an error check mechanism for user circuits such as redundancy used for a safety system or the like, and to constantly check the normality of the CRAM. However, it is not possible in principle to make zero the length of time from an occurrence of an error to error correction, and so the error remains in the CRAM during that time. Accordingly, in a case that this mechanism is applied to a controlling apparatus, there is a problem that the controlling apparatus outputs error values. In addition, there is a problem that if an error check mechanism is mounted on user circuits, the error check mechanism detects a soft error that has occurred in a CRAM before the error is detected in a CRAM cyclic check, and assesses that there is a functional anomaly, resulting in an apparatus stop, and the availability (operational continuity) deteriorates.

In addition, Patent Literature 1 describes a mechanism that checks errors in predetermined regions in a CRAM in a FPGA in a predetermined order. Although it is possible to reduce the length of time until error detection by appropriately setting error check regions, and an order thereof in this method, it is not possible in principle to make the error detection time zero, and so there is the problem mentioned before.

An object of the present invention is to reduce the likelihood that an SRAM-type FPGA, and a controller using the same are shut down due to an error detected by an error check mechanism of user circuits such as redundancy, and to enhance the availability (operational continuity) of the SRAM-type FPGA, and the controller using the same.

Solution to Problem

In a preferred example of a programmable device according to the present invention, a programmable device having a CRAM that loads CRAM data defining a user logic includes: an error check mechanism that detects, and notifies an error from redundantized user logic blocks; a previous value retaining section that is connected to an output terminal of a last user logic block, and takes in, and outputs an output value of the user logic blocks in each control period; a CRAM check section that receives a scan interrupt due to an error occurrence notification received from the error check mechanism, reads a scan region on the CRAM, implements error detection, and error correction, and notifies a success or failure of the error correction; and an error handling section that transmits an instruction for retaining a previous output of the user logic blocks to the previous value retaining section when the error occurrence notification is received, transmits an instruction for cancelling previous-value retention to the previous value retaining section, and also transmits a logical reset instruction to a user logic block relevant to an error when a notification of a success of the error correction is received from the CRAM check section.

In addition, as another feature according to the present invention, in the programmable device, in a case of a cyclic check or a scan interrupt of the CRAM, the CRAM check section executes a check of a scan region on the CRAM, implements an ECC check, and a CRC check on CRAM data read out for each read address, and, in a case that there is a CRC error, overwrites the CRAM with normal CRAM data, and assesses whether error correction on the CRAM has succeeded or failed.

In addition, as another feature according to the present invention, in the programmable device, from a time point at which the instruction for retaining a previous output of the user logic blocks that is notified from the error handling section is received until a time point at which the instruction for cancelling the previous-value retention is received, the previous value retaining section stops operation of taking in, and outputting an output value of the last user logic block at each value acquisition timing in each control period, and prevents the output value from the last user logic block from becoming an output value of the programmable device during a period of error correction on the CRAM.

Advantageous Effects of Invention

According to the present invention, it becomes possible to prevent a programmable device from outputting error values, and additionally to allow the programmable device to continue its operation without stopping the operation even in a case that a functional anomaly has occurred due to a soft error, and it becomes possible to enhance availability.

DESCRIPTION OF EMBODIMENTS

Implementation examples are explained below by using the figures.

First Implementation Example

Figure 1:
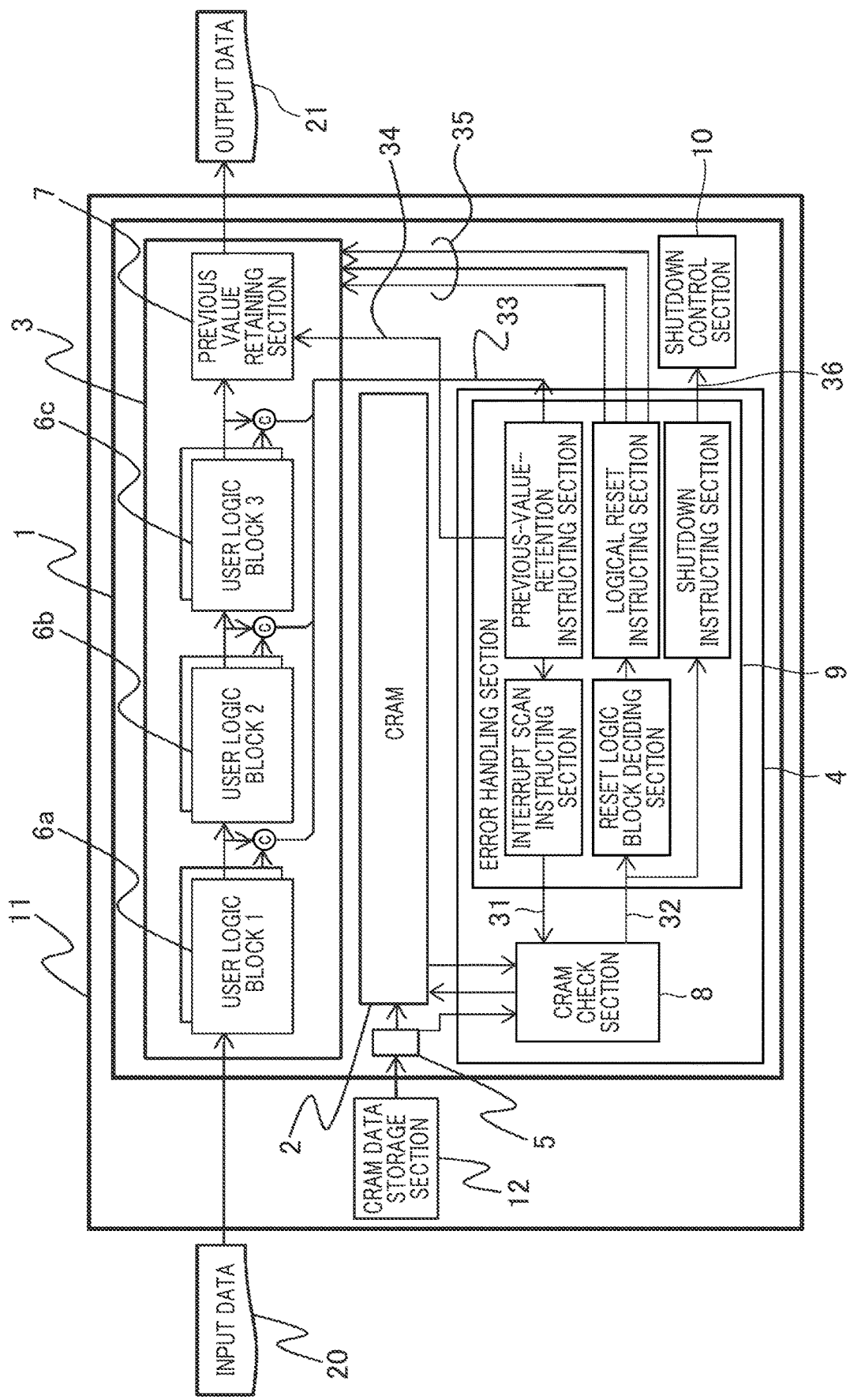
FIG. 1 is a configuration diagram of an FPGA, and a controller using the same according to a first embodiment of the present invention.

FIG. 1 is a configuration example of a controller 11 on which a FPGA 1 according to a first implementation example is mounted. The FPGA 1 connects, to the outside, a CAM data storage section 12 including, for example, a flash ROM storing CRAM data defining logical circuit information. When power is supplied to the FPGA 1, the CRAM data stored on the CAM data storage section 12 is downloaded to a CRAM 2 via a CRAM access interface circuit 5, a user-defined logical circuit is decided for the FPGA 1, and the FPGA 1 starts operation.

The FPGA 1 includes: the CRAM 2 representing a region storing logical circuit information; a user logic section 3 that performs calculations for control of user logics; an error diagnosing section 4 for the user logics; a shutdown control section 10 for the user logics; and the CRAM access interface circuit 5.

The user logic section 3 includes: duplicated user logic blocks (6a to 6c) for realizing a controller functionality; and a previous value retaining section 7 that retains output of the user logic block (6c) at the last stage in the user logic blocks in accordance with an instruction from the error diagnosing section 4. Upon receiving input of input data 20, the user logic section 3 executes calculations at the user logic blocks (6a to 6c), retains calculation execution results at the previous value retaining section 7, and outputs output data 21. Each user logic block is duplicated, and calculation results of both user logic blocks are compared at a comparator. In a case that there is an inconsistency, an error occurrence notification 33 is given to a previous-value-retention instructing section of the error diagnosing section 4.

The error diagnosing section 4 includes: a CRAM check section 8 that performs a CRAM cyclic check; and an error handling section 9 that gives an instruction for error handling in accordance with an assessment as to whether or not an error having occurred in the FPGA is caused by a soft error.

The CRAM check section 8 reads out data from the CRAM 2 storing configuration information (logical circuit information) of the user logic section 3, and checks data validity. In a case that input of a scan interrupt signal 31 including scan region information (e.g. in a case that there is an inconsistency in calculation results of the user logic block 2 (6b), a notification to that effect (an error occurrence notification) 33 arrives at the error handling section 9, and an interrupt scan instructing section of the error handling section 9 generates a scan interrupt signal 31 as scan region information representing an address of CRAM data stored on the CRAM 2 defining the configuration of the user logic block 2) is received from the error handling section 9, the CRAM check section 8 suspends a data validity check of the CRAM cyclic check that is being executed constantly, and checks the validity of the CRAM data in a region specified by the input scan region information. Upon completion of the check, a validity check result 32 including an error correction possibility/impossibility result is notified to the error handling section 9.

As an example of the technique of the validity check of the CRAM data executed at the CRAM check section 8, a method using ECC (Error Correction Code) and CRC (Cycric Redundancy Code) is depicted. ECC does not achieve a high error detection capability, but is capable of error correction, and CRC is capable of only error detection, but achieves a high error detection capability. Both methods are combined.

Figure 2:
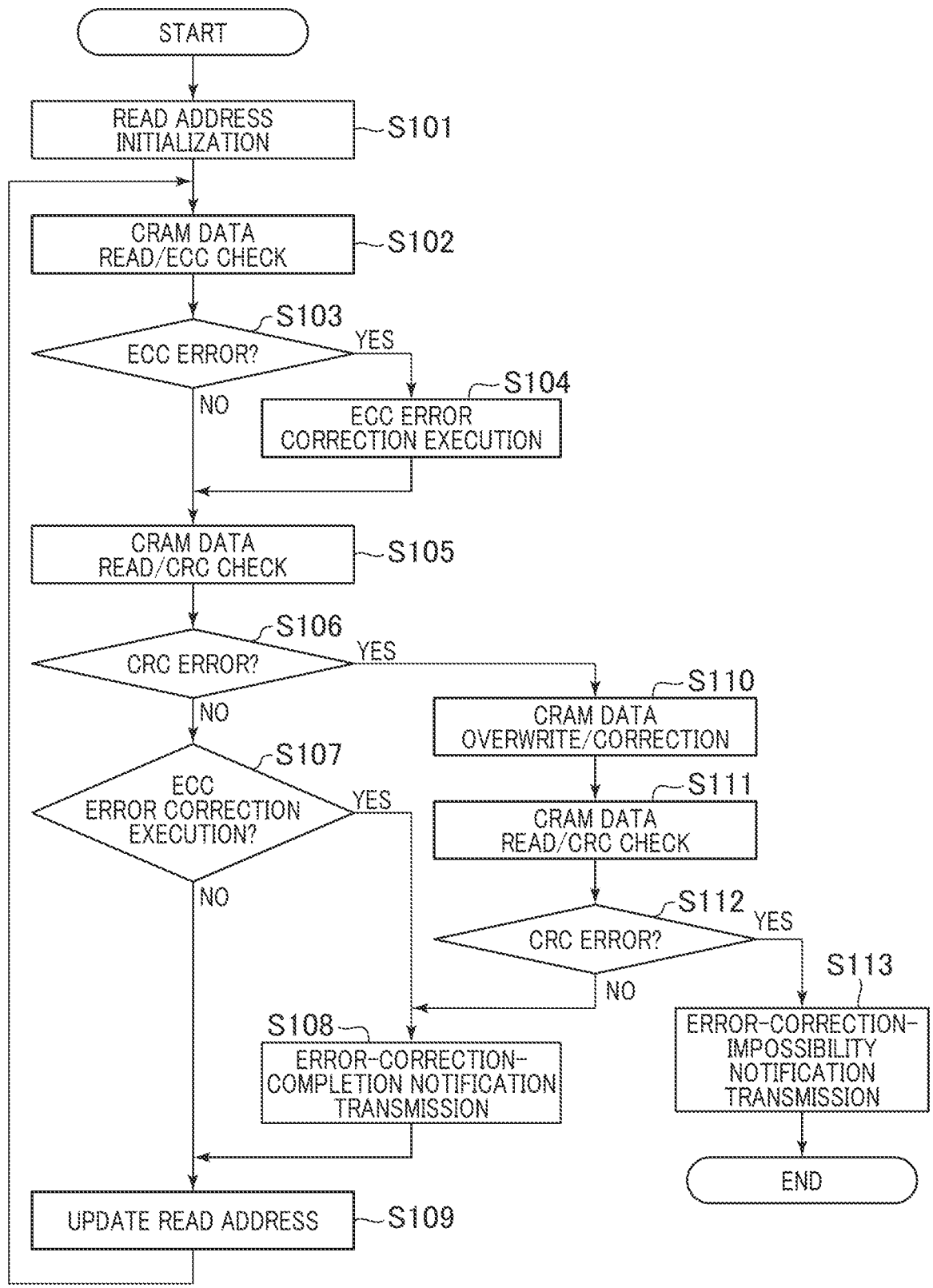
FIG. 2 is a flowchart depicting CRAM data validity check operation.

A flowchart of processes of the validity check of the CRAM data by the CRAM check section 8 is depicted in FIG. 2.

First, a read address of the CRAM data stored on the CRAM 2 whose data validity is to be checked is initialized (S101).

The CRAM data is read out in accordance with the read address, an error check is performed by using ECC (S102), and it is checked whether there is an error (S103).

In a case that there is an error at S103, error correction is performed (S104). In the error correction in this procedure, there are differences in performance such as capability of 1-bit correction or capability of 2-bit correction depending on ECC to be used. For example, in a case that the correction is performed on data having a 2-bit error by using ECC capable of 1-bit correction, the data is not corrected correctly, or it is recognized mistakenly that there are no errors, in some cases.

In order to check whether the error correction at S104 has been performed correctly, a CRC check is performed by rereading the CRAM data (S105), and it is checked whether or not there is a CRC error (S106).

In a case that there are no CRC errors at S106, it is assessed whether error correction has been performed at the procedure S104 (S107). In a case that correction has been performed, an error correction possibility notification is transmitted to the error handling section 9 (S108), then the read address is updated (S109), and the procedure proceeds to a check (S102) of the next CRAM data. At the read address updating process at S109, the read address is updated to a read address of the next CRAM at a time of the CRAM cyclic check. In addition, in a case that the scan region information is being checked in response to a scan interrupt signal, the read address is updated to a read address of the next CRAM in the scan region information. If checks of all read addresses in the scan region information have been ended, the read address is update to a read address of the CRAM cyclic check that has been suspended at a time point when the scan interrupt signal is received.

In a case that it has been known at the procedure S106 that there is a CRC error, CRAM data relevant to the read address is read out from the CRAM data storage section 12, and the CRAM data is overwritten, and corrected (S110).

In order to check whether it has been possible to correct the error at the procedure S110, a CRC check is performed by rereading the CRAM data from the CRAM 2 (S111), and it is checked whether or not there is a CRC error (S112).

In a case that there are no CRC errors at S112, it is assessed that the soft error of the CRAM data in the CRAM 2 has been corrected, an error-correction-completion notification 32 is transmitted to the error handling section 9 (S108), and the procedure proceeds to a process of updating the read address at S109.

In a case that there is a CRC error at S112, it is assessed that the error could not be corrected, or there is an error (a hard error, etc.) other than soft errors, an error-correction-impossibility notification 32 is notified to the error handling section 9 (S113), and the operation is ended.

Note that in a case that the scan interrupt signal 31 is input from the error handling section 9, the procedure returns to the read address initialization procedure S101, the CRAM data address of the region specified by the scan region information is set as a read address, and the operation of, and after the procedure S102 is performed. In the updating of the read address at the procedure S109, an address in the specified scan region is set.

In order to execute the CRAM data ECC process, and CRC process mentioned above, for example, redundant bits for ECC and CRC are retained in a SRAM (not depicted) in the FPGA 1 in advance, both redundant bits are added when the CRAM data is downloaded from the CAM data storage section 12, and stored on the CRAM 2.

Alternatively, redundant bits for ECC, and CRC may be added in advance to the CRAM data in the CAM data storage section 12.

Figure 3:
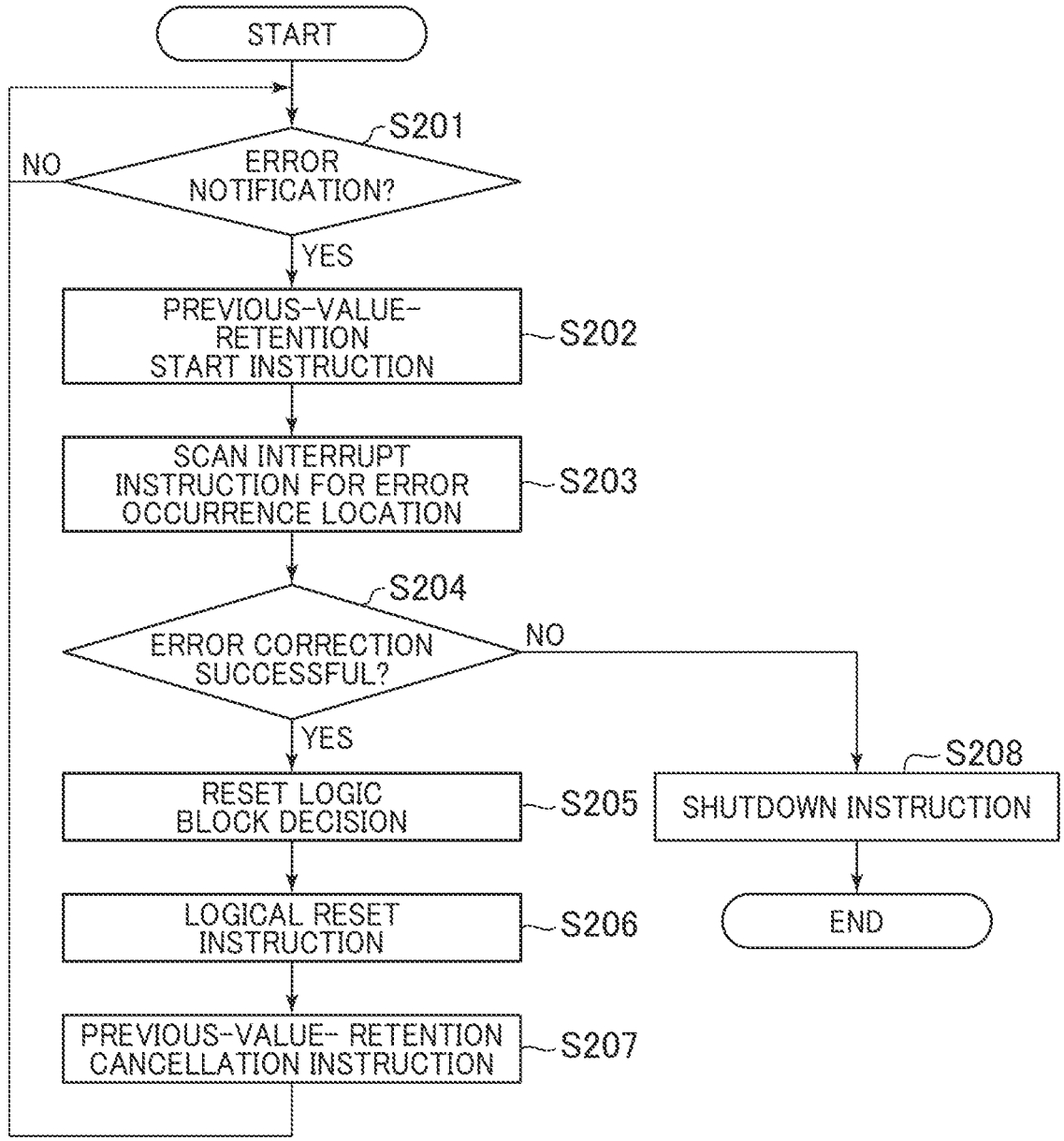
FIG. 3 is a flowchart depicting operation of an error handling section.

A flowchart of operation by the error handling section 9 is depicted in FIG. 3.

It is checked whether there is the error occurrence notification 33 from the user logic blocks (6a to 6c) (S201). In a case that there is the error occurrence notification, a previous-value-retention start instruction signal 34 is transmitted to the previous value retaining section 7 (S202), and a scan interrupt signal is transmitted to the CRAM check section 8 (S203). At that time, a region in the CRAM 2 storing configuration information (logical circuit information) of a user logic block that has transmitted the error occurrence notification is transmitted simultaneously as scan region information.

The procedure waits until the error-correction-completion notification 32 or the error-correction-impossibility notification 32 is received from the CRAM check section 8 (S204).

In a case that the error-correction-impossibility notification 32 is received at S204, a shutdown instruction 36 is transmitted to the shutdown control section 10 (S208), and the procedure is ended. The shutdown control section 10 shuts down the FPGA 1.

In a case that the error-correction-completion notification 32 is received at S204, a user logic block to be reset is decided (S205), and a logical reset instruction 35 is transmitted (S206). As a method of deciding a user logic block to be reset, there is a method in which a user logic block where there is an error, and user logic blocks following the block are treated as reset subjects. For example, supposing that all control circuits are basically configured as combination circuits, in a case that there is an error at the user logic block 2 (6b), the logical reset instruction 35 representing the user logic block 2 (6b), and the user logic block 3 (6c) as reset subjects is transmitted, and the values of all FFs (flip-flops) included in the user logic blocks are initialized.

After a lapse of a predetermined length of time after the logical reset instruction, a previous-value-retention cancellation signal 34 is transmitted to the previous value retaining section 7 (S207), subsequently the procedure proceeds to S201, and the operation is continued.

Figure 4:
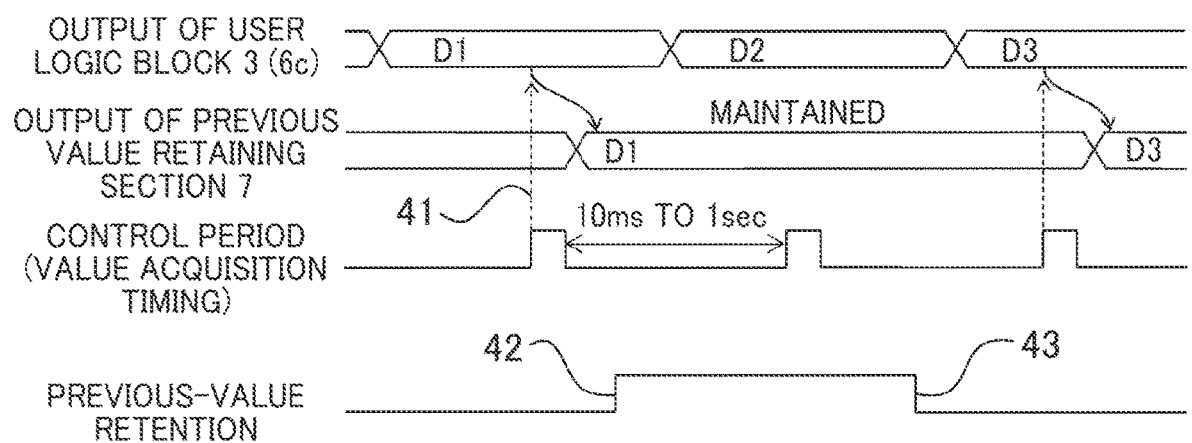
FIG. 4 is a figure for explaining functionalities of a previous value retaining section 7.

Functionalities of the previous value retaining section 7 in FIG. 1 are explained with reference to FIG. 4. Data to be output from the user logic block 3 (6c) is converted into, and output as D1, D2, and D3. Typically at a time of a value acquisition timing 41 of a control period signal, the previous value retaining section 7 repeats, in each control period, receiving values of output of the user logic block 3 (6c), and outputting them as its own output.

If there is an error at the user logic blocks (6a to 6c), and the error handling section 9 transmits the previous-value-retention start instruction signal 34 in accordance with the error occurrence notification 33, the previous-value retention state of the previous value retaining section 7 is turned on 42. Thereafter, until the error handling section 9 transmits the previous-value-retention cancellation signal 34, and the previous-value retention state of the previous value retaining section 7 is turned off 43 after error correction of CRAM data stored on the CRAM 2 succeeds, the previous value retaining section 7 keeps the output values. That is, even if the value acquisition timing 41 of a control period signal has come while the previous-value retention state that had been turned on 42 has not been turned off 43, output values of the user logic block 3 are not received, and the previous value D1 is kept being output.

This is because it is expected that the length of time that elapses after error correction of a relevant region of CRAM data stored on the CRAM 2 is ended until output values of the user logic block 3 (6c) return to their normal state will not exceed the time range of one control period. That is, in this method, because it is expected that the output value D2 of the user logic block 3 (6c) is a value that cannot be trusted due to a soft error of the CRAM data of the CRAM 2, it is not treated as output of the previous value retaining section 7, but the previous value D1 is used instead.

If an error occurs in the previous value retaining section 7, it becomes not possible to retain previous values of output, a measure such as a shutdown becomes necessary, and there is a possibility that the availability of the controller deteriorates. However, because the logical scale of the previous value retaining section 7 is small as compared with the main functionalities (6a to 6c) such as calculation, the dominant factor of the deterioration of availability is a shutdown caused by an occurrence of a soft error in the main functionalities. Accordingly, the configuration of the present implementation example can enhance the availability. For the purpose of enhancing the availability further, there is configuration that uses a highly noise-tolerant component for the previous value retaining section 7, for example, a discrete component, a Flash-type type FPGA or the like. That is, the previous value retaining section 7 may be arranged not in the FPGA 1 in FIG. 1, but may be arranged outside the FPGA 1, and on the controller 11.

In a case that an error occurs in the error diagnosing section 4, the functionalities of the FPGA 1 can be maintained, but if an error occurs in the user logic blocks (6a to 6c), it becomes not possible to perform detection, and correction. In one possible method, the error diagnosing section 4 is redundantized in order to enhance the error correction reliability of the error diagnosing section 4. An error monitoring section of an error diagnosing section that monitors inconsistencies between output of the redundantized error diagnosing sections may be provided, and the error monitoring section may output a shutdown control signal to the shutdown control section 10 at a time of occurrence an inconsistency between the output.

In addition, in one of possible methods, in order to diagnose the normality of the error diagnosing section 4, for example, diagnostic data is output for each step of operation of the CRAM check section 8 and the error handling section 9, and checks are performed outside.

According to the FPGA 1 in the present implementation example, it is possible to reduce the likelihood that the controller is shut down due to an error detected by an error check mechanism of user circuits such as redundancy, and it is possible to enhance the availability of the controller.

Note that it can be expected that the FPGA 1 in the present implementation example provides similar effects even if it is used for uses other than those for the controller.

Second Implementation Example

Figure 5:
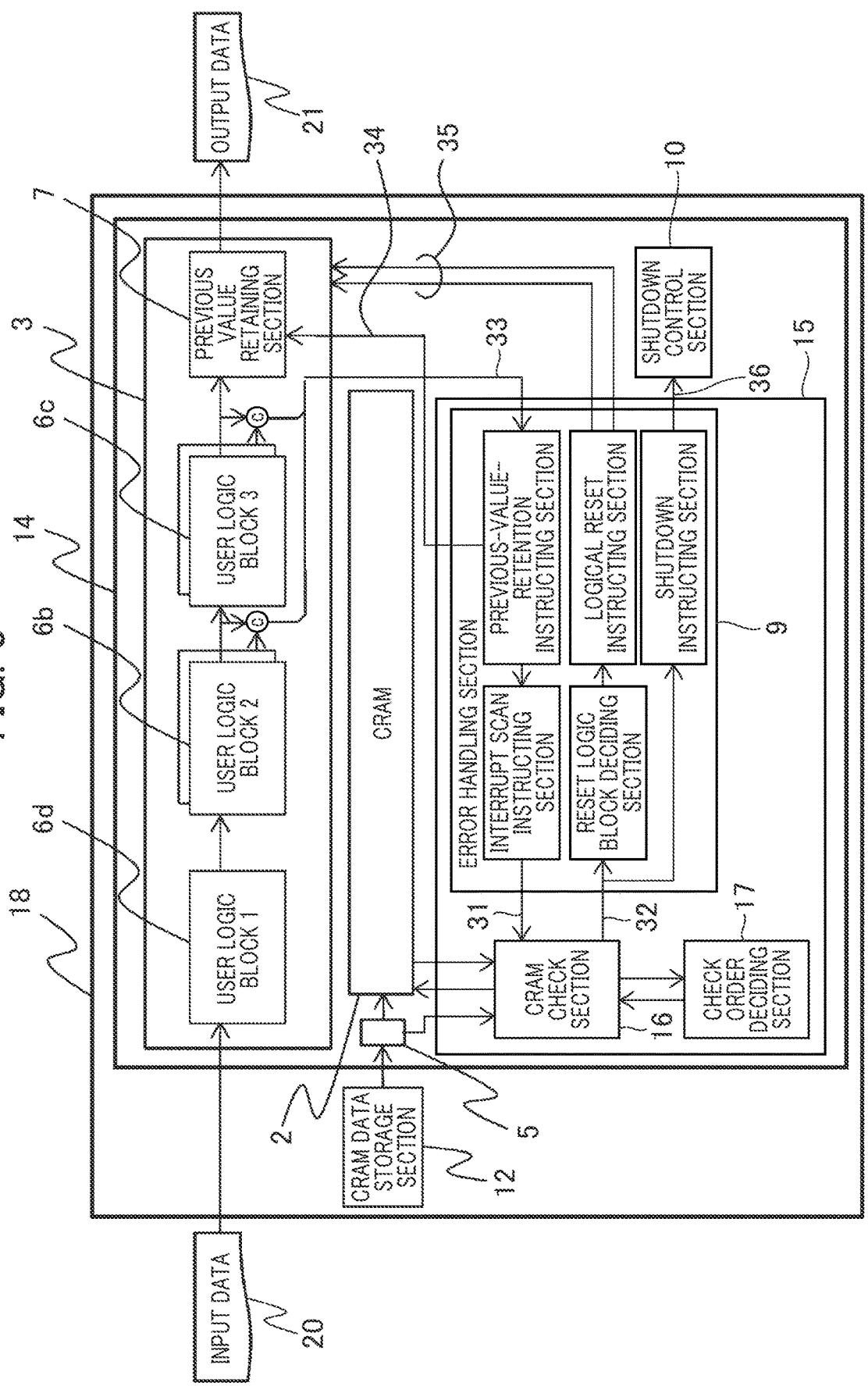
FIG. 5 is a configuration diagram of a FPGA, and a controller using the same according to a second embodiment of the present invention.

FIG. 5 is a second implementation example. Portions that have counterparts in FIG. 1 are given the same reference signs, and because their configuration, and operation are the same, explanations thereof are omitted. In the present implementation example, the CRAM check is executed by giving priorities to the user logic blocks. Instead of the error diagnosing section 4 which is a constituent element of the FPGA 1 in FIG. 1, a FPGA 14 in the present implementation example has, as a constituent element, an error diagnosing section 15 including: a check order deciding section 17 that decides a check order of the CRAM check; and a CRAM check section 16 that constantly executes the CRAM check in accordance with the check order decided at the check order deciding section 17.

Figure 6:
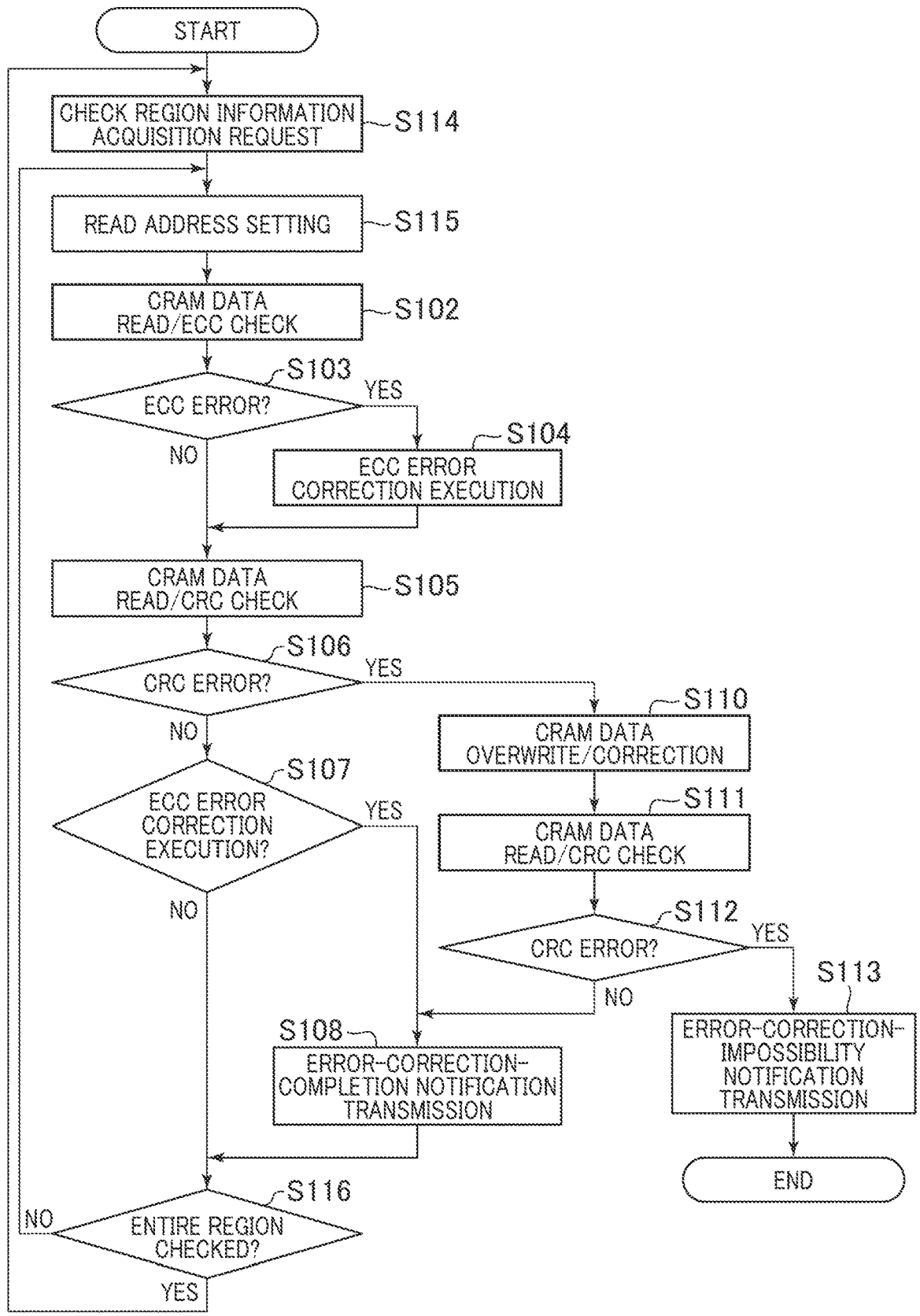
FIG. 6 is a flowchart depicting the CRAM data validity check operation according to the second embodiment.

FIG. 6 depicts a flow of operation by the CRAM check section 16. Portions that have counterparts in the flow of operation in FIG. 2 are gave the same step numbers, and because their operation is the same, explanations thereof are omitted.

Before starting the CRAM check operation (S102 to S113), the CRAM check section 16 acquires region information to be checked from the check order deciding section 17 (S114). As the region information, at least one or more CRAM address ranges included in a region are included.

The CRAM check section 16 sets, as a read address, one of addresses in the CRAM address ranges in the acquired region information (S115), and executes the CRAM check operation (S102 to S113).

Upon completion of the CRAM check operation after determining that there are no errors or transmitting an error-correction-completion notification, it is assessed at S114 whether checks of CRAM data of all the CRAM addresses in the region acquired from the check order deciding section 17 have been completed (S116). As an example assessment method, for example, a list of all candidate address values is made about the CRAM address ranges included in the region information acquired at S114, a subject address is deleted from the list after it is set as a read address at Step S115, and it is assessed at Step S116 that all the CRAM checks in the region have been completed if the list is empty.

If checks of the entire CRAM data in the region have not been completed at Step S116, the procedure proceeds to S115, a read address is decided again (S115), and the CRAM check operation is repeated.

If checks of the entire CRAM data in the region have been completed at Step S116, the procedure proceeds to S114, the next check region information is acquired from the check order deciding section 17 (S114), a read address is set (S115), and the CRAM check operation is repeated.

Figure 7:
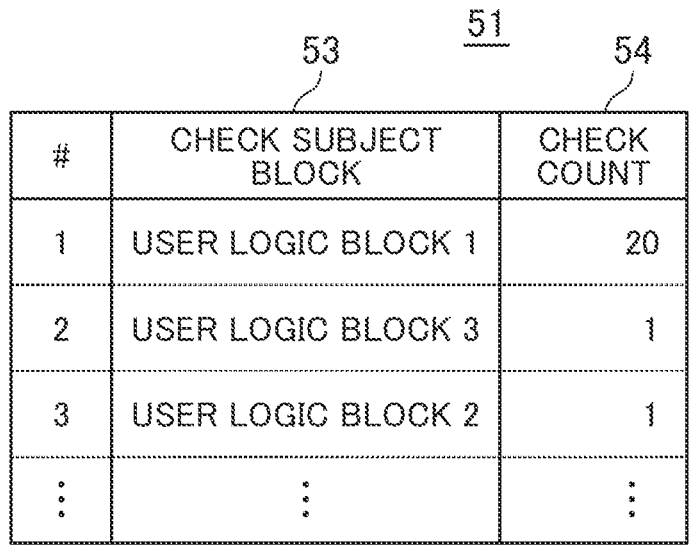
FIG. 7 is a figure depicting configuration examples of a check count table, and a CRAM address range information table.

Upon receiving a region information request from the CRAM check section 16, the check order deciding section 17 generates region information by using a check count table, and a CRAM address range information table that are retained therein, and transmits the region information to the CRAM check section 16. FIG. 7 is configuration examples of a check count table 51, and a CRAM address range information table 52.

The check count table 51 is a table representing correspondence between names (53) of check subject blocks, and check counts (54) of the blocks. For example, the example in FIG. 7 depicts that the user logic block 1 is checked 20 times, the user logic block 3 is checked once, and the user logic block 2 is checked once, in this order.

The CRAM address range information table 52 is a table representing correspondence between names (55) the blocks, and one or more address ranges (56) of the CRAM forming the blocks.

Upon receiving a region information request from the CRAM check section 16, the check order deciding section 17 performs conversion into a CRAM address range 56 by using the CRAM address range information table 52 relevant to a check subject block decided by using the check count table 51, and transmits the CRAM address range 56 to the CRAM check section 16.

By providing this functionality, CRAM check frequencies of user logic blocks in the FPGA 14 mounted on a controller 18 can be set freely. As a way of thinking about setting of check frequencies, for example, for reasons such as FPGA resource insufficiency, the CRAM check of a user logic block (6d in FIG. 5) for which an error check mechanism such as duplication cannot be provided, and which is less error-tolerant is performed frequently, the CRAM check of user logic blocks (6b, and 6c in FIG. 5) for which an error check mechanism such as duplication is provided is performed less frequently, and so on, in one possible method.

In another example method, user logic blocks are divided into one that achieves a control functionality of a sequencer and the like, and a data processing functionality of calculation and the like, a CRAM of the user logic block that realizes the control functionality is checked frequently, and a CRAM of the user logic block that realizes the data processing functionality is checked less frequently, and so on.

According to the present implementation example, it becomes possible to freely set the CRAM check frequency for each user logic block, and the availability of even the controller 18 including user logic blocks not having an error check mechanism can be enhanced.

Note that it can be expected that the FPGA 14 in the present implementation example provides similar effects even if it is used for uses other than those for the controller.

LIST OF REFERENCE SIGNS

1: FPGA
2: CRAM representing region to store logical circuit information
3: User logic section
4: Error diagnosing section
5: CRAM access interface circuit
6a, 6b, 6c, 6d: User logic block
7: Previous value retaining section
8: CRAM check section
9: Error handling section
10: Shutdown control section
11: Controller
12: CAM data storage section
14: FPGA according to second implementation example
15: Error diagnosing section according to second implementation example
16: CRAM check section according to second implementation example
17: Check order deciding section
18: Controller according to second implementation example
20: Input data
21: Output data
31: Scan interrupt signal
32: Validity check result including error correction possibility/impossibility result
33: Error occurrence notification
34: Previous-value-retention start instruction signal/previous-value-retention cancellation signal
35: Logical reset instruction
36: Shutdown instruction
41: Value acquisition timing of control period signal
42: Previous-value retention state is turned on
43: Previous-value retention state is turned off
51: Check count table
52: CRAM address range information table
53: Name of check subject block
54: Check count
55: Name of block
56: CRAM address range

The invention claimed is:

1. A programmable device having a CRAM that loads CRAM data defining a user logic, the programmable device comprising:
an error check mechanism that detects, and notifies an error from redundantized user logic blocks;
a previous value retaining section that is connected to an output terminal of a last user logic block, and takes in, and outputs an output value of the user logic blocks in each control period;
a CRAM check section that receives a scan interrupt due to an error occurrence notification received from the error check mechanism, reads a scan region on the CRAM, implements error detection, and error correction, and notifies a success or failure of the error correction; and
an error handling section that transmits an instruction for retaining a previous output of the user logic blocks to the previous value retaining section when the error occurrence notification is received, transmits an instruction for cancelling previous-value retention to the previous value retaining section, and also transmits a logical reset instruction to a user logic block relevant to an error when a notification of a success of the error correction is received from the CRAM check section.

2. The programmable device according to claim 1, wherein when the error occurrence notification is received from the error check mechanism, the error handling section transmits an instruction for retaining a previous output of the user logic blocks to the previous value retaining section, and also transmits, to the CRAM check section, a scan interrupt signal as scan region information representing a region of the CRAM storing configuration information of a user logic block which is an error occurrence location.

3. The programmable device according to claim 1, further comprising a shutdown control section that shuts down the programmable device, wherein
in a case that an error-correction-impossibility notification is received from the CRAM check section, the error handling section transmits a shutdown instruction to the shutdown control section.

4. The programmable device according to claim 1, wherein in a case of a cyclic check or a scan interrupt of the CRAM, the CRAM check section executes a check of a scan region on the CRAM, implements an ECC check, and a CRC check on CRAM data read out for each read address, and, in a case that there is a CRC error, overwrites the CRAM with normal CRAM data, and assesses whether error correction on the CRAM has succeeded or failed.

5. The programmable device according to claim 1, wherein from a time point at which the instruction for retaining a previous output of the user logic blocks that is notified from the error handling section is received until a time point at which the instruction for cancelling the previous-value retention is received, the previous value retaining section stops operation of taking in, and outputting an output value of the last user logic block at each value acquisition timing in each control period, and prevents the output value from the last user logic block from becoming an output value of the programmable device during a period of error correction on the CRAM.

6. The programmable device according to claim 1, further comprising a check order deciding section that sets a CRAM check order and a check count of the CRAM check section, wherein
the check order deciding section has at least:
a check count table in which a check count of each user logic block is set; and
a CRAM address information table in which a range of addresses on the CRAM where configuration information (CRAM data) of each user logic block is stored is set, and
the CRAM check section repeats a process of acquiring, from the check order deciding section, a range of addresses on the CRAM that should be checked next, reading CRAM data of all CRAM addresses within the acquired range, implementing error detection, and error correction, and notifying a success or failure of the error correction.

7. The programmable device according to claim 1, wherein
the CRAM check section, and the error handling section have redundantized configuration, and the programmable device further comprises a diagnosing-section error monitoring section that monitors an inconsistency among output of redundantized circuits, and the diagnosing-section error monitoring section outputs a shutdown control signal to a shutdown control section at a time of occurrence of an output inconsistency.

8. A controller, wherein the previous value retaining section of the programmable device according to claim 1 is configured with a highly noise-tolerant discrete component or Flash-type FPGA different from the user logic blocks, and is arranged outside the programmable device.

9. A controller, wherein the previous value retaining section of the programmable device according to claim 5 is configured with a highly noise-tolerant discrete component or Flash-type FPGA different from the user logic blocks, and is arranged outside the programmable device.

* * * * *